United States Patent
Yan

(10) Patent No.: US 9,362,528 B2
(45) Date of Patent: Jun. 7, 2016

(54) PACKAGING STRUCTURE AND PACKAGING METHOD OF ORGANIC ELECTROLUMINESCENT DEVICE, AND DISPLAY DEVICE

(71) Applicant: BOE TECHNOLOGY GROUP CO., LTD., Beijing (CN)

(72) Inventor: Guang Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/436,151

(22) PCT Filed: Aug. 27, 2014

(86) PCT No.: PCT/CN2014/085317
§ 371 (c)(1),
(2) Date: Apr. 16, 2015

(87) PCT Pub. No.: WO2015/165182
PCT Pub. Date: Nov. 5, 2015

(65) Prior Publication Data
US 2015/0380684 A1  Dec. 31, 2015

(30) Foreign Application Priority Data
Apr. 29, 2014 (CN) .......................... 2014 1 0177534

(51) Int. Cl.
*H01L 21/00* (2006.01)
*H01L 51/52* (2006.01)
*H01L 51/56* (2006.01)

(52) U.S. Cl.
CPC ........ *H01L 51/5256* (2013.01); *H01L 51/5253* (2013.01); *H01L 51/56* (2013.01); *H01L 2251/5369* (2013.01)

(58) Field of Classification Search
CPC .. H01L 51/5256; H01L 51/56; H01L 51/5253
See application file for complete search history.

(56) References Cited

U.S. PATENT DOCUMENTS 6,835,950 B2 12/2004 Brown et al.
7,659,012 B2 2/2010 Kim et al.
(Continued)

FOREIGN PATENT DOCUMENTS

CN 1678140 A 10/2005
CN 101518151 A 8/2009
(Continued)

OTHER PUBLICATIONS

English translation of the International Search Report of PCT/CN2014/085317, mailed Jan. 28, 2015.
(Continued)

*Primary Examiner* — Laura Menz
(74) *Attorney, Agent, or Firm* — Collard & Roe, P.C.

(57) ABSTRACT

A packaging structure and a packaging method of an organic electroluminescent device, and a display device are provided. The packaging structure of the organic electroluminescent device comprises: a base substrate (1) for supporting the organic electroluminescent device (2); the organic electroluminescent device (2) located on the base substrate (1); at least one first thin film packaging layer (3) covering the organic electroluminescent device (2), the first thin film packaging layer (3) comprising an inorganic thin film (31), an organic polymer thin film (32) and a nano rod-shaped thin film (33) located between the inorganic thin film (31) and the organic polymer thin film (32). The packaging structure and the packaging method of the organic electroluminescent device can effectively improve a degree of integration between the inorganic thin film (31) and the organic polymer thin film (32), thus guaranteeing a service life of an OLED device.

20 Claims, 1 Drawing Sheet

(56) References Cited

U.S. PATENT DOCUMENTS

| | | |
|---|---|---|
| 2003/0197197 A1 | 10/2003 | Brown et al. |
| 2010/0089636 A1 | 4/2010 | Ramadas et al. |
| 2010/0213828 A1 | 8/2010 | Seo et al. |
| 2010/0264817 A1* | 10/2010 | Bouten ............. G02F 1/133305 313/512 |
| 2011/0048538 A1* | 3/2011 | Huang ................. H01L 51/441 136/265 |
| 2011/0290551 A1 | 12/2011 | Lee |
| 2012/0164434 A1 | 6/2012 | Ramadas et al. |
| 2012/0207991 A1* | 8/2012 | Arai ........................ B32B 15/08 428/216 |
| 2013/0052763 A1* | 2/2013 | Choi ...................... B82Y 30/00 438/23 |
| 2013/0143414 A1* | 6/2013 | Thomas .......... H01L 31/022466 438/761 |
| 2014/0179040 A1 | 6/2014 | Ramadas et al. |
| 2015/0380684 A1* | 12/2015 | Yan ........................ H01L 51/52 257/40 |

FOREIGN PATENT DOCUMENTS

| | | |
|---|---|---|
| CN | 101819985 A1 | 9/2010 |
| CN | 102057750 A | 5/2011 |
| CN | 102437288 A | 5/2012 |
| CN | 102458852 A | 5/2012 |
| CN | 102593371 A | 7/2012 |
| CN | 103972422 A | 8/2014 |

OTHER PUBLICATIONS

English translation of the Written Opinion of the International Searching Authority of PCT/CN2014/085317, mailed Jan. 28, 2015.
Written Opinion of the International Searching Authority with Notice of Transmittal of the International Search Report and Written Opinion for PCT/CN2014/085317 in Chinese, mailed Jan. 28, 2015.
International Search Report of the International Searching Authority of PCT/CN2014/085317 in Chinese, mailed Jan. 28, 2015.
The First Office Action for CN 201410177534.1 issued on Dec. 19, 2014 in Chinese with an English translation.
The Notification to Grant the Patent Right (Notice of Allowance) for CN 201410177534.1 issued on Mar. 11, 2015 in Chinese with an English translation.
The Issued Patent for CN 103972422 B (Application Number: CN 201410177534.1) which was granted on Apr. 15, 2015 in Chinese with the Chinese granted claims with an English translation.

* cited by examiner

PACKAGING STRUCTURE AND PACKAGING METHOD OF ORGANIC ELECTROLUMINESCENT DEVICE, AND DISPLAY DEVICE

CROSS REFERENCE TO RELATED APPLICATIONS

This application is the National Stage of PCT/CN2014/085317filed on Aug. 27, 2014, which claims priority under 35 U.S.C. §119 of Chinese Application No. 201410177534.1 filed on Apr. 29, 2014, the disclosure of which is incorporated by reference.

TECHNICAL FIELD

Embodiments of the invention relate to a packaging structure and a packaging method of an organic electroluminescent device, and a display device.

BACKGROUND

An organic electroluminescent device, also known as organic light emitting diode (OLED) device, is a new kind of display technology, and the OLED device has become a future trend of display device market with its advantages such as high brightness, abundant colors, low-voltage DC driving and simple preparation process and so on.

Generally, the OLED device employs a rigid glass substrate or a flexible polymer substrate as a carrier, and is formed by depositing an anode and a cathode as well as an organic light emitting layer therebetween. The organic light emitting layer typically includes a hole injection layer, a hole transport layer, a light emitting layer, an electron transport layer and an electron injection layer and so on. The organic light emitting layer is very sensitive to oxygen and water vapor; if the oxygen and water vapor permeate into the organic light emitting layer, it will cause many undesirable phenomena such as black dot, needle hole, electrode oxidization, chemical reaction of organic materials and so on, which can severely affect a service life of the OLED device. Therefore, a packaging technology is a key of realizing industrialization of OLED.

Inventors find that a commonly used packaging technology is a thin-film packaging technology, which is based on a multilayer structure alternating between an organic polymer thin film and an inorganic thin film prepared by a vacuum coating process. With high density, the inorganic thin film is a main layer to barrier water and oxygen. But the inorganic thin film has less elasticity and greater internal stress, while the organic polymer thin film has higher elasticity, resulting in easy separation between the inorganic thin film and the organic polymer film, so the water and oxygen may invade into the organic light emitting layer, which can severely affect the service life of OLED device.

SUMMARY OF THE INVENTION

According to an embodiment of the present invention, there is provided a packaging structure of an organic electroluminescent device, comprising:

A base substrate for supporting the organic electroluminescent device;

The organic electroluminescent device located on the base substrate;

At least one first thin film packaging layer covering the organic electroluminescent device, the first thin film packaging layer comprising an inorganic thin film, an organic polymer thin film and a nano rod-shaped thin film located between the inorganic thin film and the organic polymer thin film In an example, the packaging structure further comprises a second thin film packaging layer, and the second thin film packaging layer comprises an inorganic thin film and an organic polymer thin film, and the second film layer is located above or below the first thin film packaging layer.

In an example, a number of the at least one first thin film packaging layer is 1~20.

In an example, the number of the at least one first thin film packaging layers is 3~5.

In an example, a sum of numbers of the at least first thin film packaging layer and the second thin film packaging layer is 1~20.

In an example, a sum of the numbers of the at least one first thin film packaging layer and the second thin film packaging layer is 3~5.

In an example, the inorganic thin film is made from one of a metal oxide, a metal sulfide and a metal nitride; and the nano rod-shaped thin film is made from one of a metal oxide, a metal sulfide and a metal nitride.

In an example, the inorganic thin film and the nano rod-shaped thin film in a first thin film packaging layer are made from a material with a same chemical composition.

In the technical solution of the embodiment of the present invention, the organic electroluminescent device is covered by at least one first thin film packaging layer; specifically, the first thin film packaging layer comprises an inorganic thin film, an organic polymer thin film and a nano rod-shaped thin film between the inorganic thin film and the organic polymer thin film, and the nano rod-shaped thin film is directly fabricated and formed on the inorganic thin film, both of which are thin films formed of the same material or materials with similar chemical and physical properties by injection of inorganic particles, so the nano rod-shaped thin film and the inorganic thin film are closely bonded. Meanwhile, due to a rough surface of the nano rod-shaped thin film and a loose arrangement between the particles, the nano rod-shaped thin film and the organic polymer thin film have a much larger effective contact area, and partly run through each other, effectively improving a degree of integration between the nano rod-shaped thin film and the organic polymer thin film, and thereby preventing separation between the inorganic thin film and the organic polymer thin film, guaranteeing the service life of the OLED device.

According to another embodiment of the present invention, there is provided a display device, comprising the packaging structure of the organic electroluminescent device described above.

According to still another embodiment of the present invention, there is provided a packaging method of an organic electroluminescent device, comprising:

Providing a base substrate;

Preparing the organic electroluminescent device on the base substrate;

Forming at least one first thin film packaging layer on the organic electroluminescent device, the first thin film packaging layer comprising an inorganic thin film, an organic polymer thin film and a nano rod-shaped thin film located between the inorganic thin film and the organic polymer thin film.

In an example, forming the first thin film packaging layer on the organic electroluminescent device includes:

Forming the inorganic thin film on the organic electroluminescent device;

Forming the nano rod-shaped thin film on the inorganic thin film;

Forming the organic polymer thin film on the nano rod-shaped thin film.

In an example, forming the nano rod-shaped thin film on the inorganic thin film includes:

Forming the nano rod-shaped thin film on the inorganic thin film by vacuum evaporating, ion beam sputtering, magnetron-control sputtering deposition or atomic layer deposition, wherein an include angle between an injected particle flux for forming the nano rod-shaped thin film and a normal line of the inorganic thin film is 40°~85°.

In an example, the packaging method further comprises: forming a second thin film packaging layer on the organic electroluminescent device, wherein the second thin film packaging layer comprises the inorganic thin film and the organic polymer thin film.

In an example, a number of the at least one first thin film packaging layer is 1~20.

In an example, the number of the at least one first thin film packaging layers is 3~5.

In an example, a sum of numbers of the at least one first thin film packaging layer and the second thin film packaging layer is 1~20.

In an example, a sum of the numbers of the at least one first thin film packaging layer and the second thin film packaging layer is 3~5.

In an example, the inorganic thin film is made from one of a metal oxide, a metal sulfide and a metal nitride; and the nano rod-shaped thin film is made from one of a metal oxide, a metal sulfide and a metal nitride.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

Figure 1:
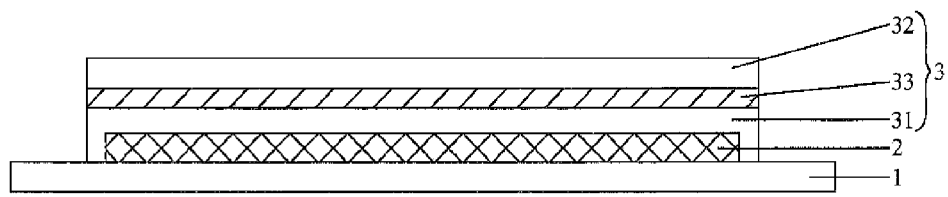
FIG. 1 is a structural schematic diagram I of a packaging structure of an organic electroluminescent device in an embodiment of the present invention.

As illustrated in FIG. 1, an embodiment of the present invention provides a packaging structure of an organic electroluminescent device, comprising:

A base substrate 1 for supporting the organic electroluminescent device 2; the organic electroluminescent device 2 located on the base substrate 1; and at least a first thin film packaging layer 3 covering the organic electroluminescent device 2. The first thin film packaging layer 3 comprises an inorganic thin film 31, an organic polymer thin film 32 and a nano rod-shaped thin film 33 between the inorganic thin film 31 and the organic polymer thin film 32.

The nano rod-shaped thin film 33 is similar to the inorganic thin film 31, both of which can by prepared by vacuum evaporating, ion beam sputtering, magnetron-control sputtering deposition or atomic layer deposition. Differently, when the inorganic thin film 31 is formed, an included angle between an injected particle flux and a normal line of the base substrate is 0°, so that the particles are uniformly deposited on the base substrate, to form an inorganic thin film with a smooth surface and a compact arrangement; when the nano rod-shaped thin film 33 is formed, the included angle between the injected particle flux and the normal line of the substrate is 40°~85°; compared to the inorganic thin film 31, the nano rod-shaped thin film 33 has a much rougher surface and a looser arrangement of particles. For example, the nano rod-shaped thin film refers to a kind of thin film containing a plurality of nano-level rod-shaped structures.

Apparently, the nano rod-shaped thin film 33 is directly fabricated and formed on the inorganic thin film 31, both of which are thin films formed of the same material or materials with similar chemical and physical properties by the injection of the inorganic particles, so the nano rod-shaped thin film 33 and the inorganic thin film 31 are closely bonded. For example, the inorganic thin film 31 and the nano rod-shaped thin film 33 are made from a material with same chemical composition, and just the structures are varied by different technical parameters during formation. Meanwhile, due to the rough surface of the nano rod-shaped thin film 33 and the loose arrangement between the particles, the nano rod-shaped thin film. 33 and the organic polymer thin film has a much larger effective contact area, and partly run through each other, effectively improving the degree of integration between the nano rod-shaped thin film 33 and the organic polymer thin film 32, so the inorganic thin film 31, the organic polymer thin film 32 and the nano rod-shaped thin film 33 can be integrated tightly, and thereby preventing the separation between the inorganic thin film 31 and the organic polymer thin film 32.

In the technical solution of the embodiment of the present invention, the organic electroluminescent device is covered by at least a first thin film packaging layer. The first thin film packaging layer comprises an inorganic thin film, an organic polymer thin film and a nano rod-shaped thin film between the inorganic thin film and the organic polymer thin film, and the nano rod-shaped thin film is directly fabricated and formed on the inorganic thin film, both of which are thin films formed of the same material or materials with similar chemical and physical properties by the injection of the inorganic particles, so the nano rod-shaped thin film and the inorganic thin film are closely bonded. Meanwhile, due to the rough surface of the nano rod-shaped thin film and the loose arrangement between the particles, the nano rod-shaped thin film and the organic polymer thin film have a much larger effective contact area, and partly run through each other, effectively improving the degree of integration between the nano rod-shaped thin film and the organic polymer thin film, and thereby preventing the separation between the inorganic thin film and the organic polymer thin film, guaranteeing the service life of the OLED device.

In addition, the nano rod-shaped film 33 has a good transmittance, which can improve the light intensity of the OLED device, and enhance a display effect of an OLED display apparatus.

Further, in order to simplify the production flow of the packaging structure and reduce the production process of the packaging structure, the packaging structure further includes a second thin film packaging layer 4, and the second thin film packaging layer 4 consists of an inorganic thin film and an organic polymer thin film, and the second film layer is located above or below the first thin film packaging layer. That is, the second thin film packaging layer can be arranged between the first thin film packaging layer and the organic electroluminescent device, or can be arranged in a side of the first thin film packaging layer opposite to the organic electroluminescent device. The second thin film packaging layer 4 is not provided with a nano rod-shaped thin film The inorganic thin film and the organic polymer thin film, which match with each other at higher level, can be selected through experiments, resulting in enhancing an attaching degree between the inorganic thin film and the organic polymer thin film of the second thin film packaging layer 4.

It should be noted that, in the embodiment of the invention, the first thin film packaging layer 3 and the second thin film packaging layer 4 are collectively referred to as a thin film packaging layer.

Figure 2:
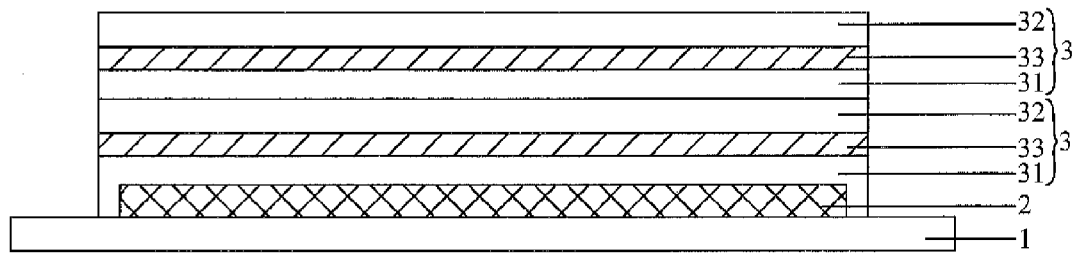
FIG. 2 is a structural schematic diagram II of the packaging structure of the organic electroluminescent device in the embodiment of the present invention.
Figure 3:
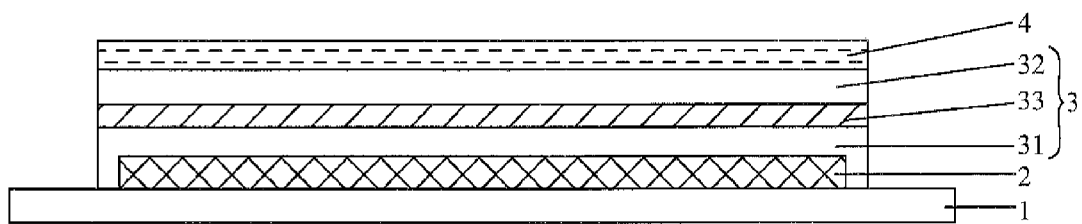
FIG. 3 is a structural schematic diagram III of the packaging structure of the organic electroluminescent device in the embodiment of the present invention.

The OLED device can be covered with a layer or several layers of thin film packaging layers according to the actual needs. In a case where both water resistance and oxygen resistance capacity and lightening and thinning are taken into account, the OLED device can be covered with 1~20 layers of thin film packaging layers, that is, if there is only the first thin film packaging layer 3, the number of the thin film packaging layers 3 is 1~20; if the first thin film packaging layer 3 and the second thin film packaging layer 4 are included, a sum of the numbers of the first thin film packaging layer 3 and the second thin film packaging layer 4 is 1~20. As illustrated in FIG. 2 or FIG. 3, there are multiple layers of thin film packaging layers to overlay each other, and cover the OLED device.

As illustrated in FIGS. 1-3, in the packaging structure of the organic electroluminescent device, at least the packaging layer in contact with the organic electroluminescent device 2 shall completely encapsulate a top surface and side surfaces of the organic electroluminescent device 2. For example, the inorganic thin film 31 of the first packaging layer shall completely encapsulate the top surface and side surfaces of the organic electroluminescent device 2.

But if there are too much thin film packaging layers, the intensity of the exiting light of the display device may be affected, reducing the display effect of the display device; while if there are few thin film packaging layers, the tightness of the OLED device may not be guaranteed, so preferably, the number of the first thin film packaging layers is 3~5, at which time, the intensity of the exiting light of the display device will be good, meanwhile the tightness of the OLED device will be guaranteed. Similarly, a sum of the numbers of the first thin film packaging layer 3 and the second thin film packaging layer 4 is preferably 3~5.

In the embodiment of the present invention, the nano rod-shaped thin film 33 may be made from a metal oxide, a metal nitride or a metal sulfide. The metal oxide includes calcium oxide, tantalum pentoxide, titanium dioxide, zirconium dioxide, copper oxide, zinc oxide, aluminum oxide, chromium oxide, tin oxide, nickel oxide and antimony pentoxide; the metal sulfide includes titanium disulfide, iron sulfide, chromium trisulfide, copper sulfide, zinc sulfide, tin sulfide, nickel sulfide, cobalt trisulfide, antimony trisulfide, lead sulfide, lanthanum trisulfide, cerium sulfide, zirconium disulfide and the like; and the metal nitride includes silicon nitride, aluminum nitride and the like. Similarly, the inorganic thin film 31 is also made from one of a metal oxide, a metal sulfide and a metal nitride.

The inorganic thin film 31 and the nano rod-shaped thin film 33 in the same first thin film packaging layer 3 can be made from the same material, or a free combination of materials according to the actual situation, and the inorganic thin film 31 of each thin film packaging layer can be made from different materials; similarly, the nano rod-shaped thin film 33 of each thin film packaging layer can be made from different materials, too.

Further, the organic polymer thin film 32 is made from polyethylene terephthalate (PET), polyethylene naphthalate polymer (PEN), polycarbonate (PC), polyimide (PI), polyvinyl chloride (PVC), polystyrene (PS), polymethyl methacrylate (PMMA), polybutylene terephthalate (PBT), polysulfone (PSO), poly(p-phenylene diethyl sulfone) (PES), polyethylene (PE), polypropylene (PP), silicone, polyamide (PA), polyvinylidene fluoride (PVDF), ethylene-vinyl acetate copolymer (EVA), ethylene - vinyl alcohol copolymer (EVAL), poly acrylonitrile (PAN), polyvinyl acetate (PVAC), parylene, polyarea or polytetrafluoroethylene (PTFE), epoxy resin and the like.

An embodiment of the present invention further provides a display device, comprising the packaging structure of the organic electroluminescent device described above, and it is obvious that the display device is an OLED display device, which can be a display device such as a mobile phones, a tablet computer, a laptop, and a TV and so on.

Second Embodiment

The embodiment of the present invention provides a packaging method of an organic electroluminescent device, comprising:

S101: providing a base substrate.

S102: preparing the organic electroluminescent device on the base substrate.

S103: forming at least a first thin film packaging layer on the organic electroluminescent device, the first thin film comprises an inorganic thin film, an organic polymer thin film and a nano rod-shaped thin film between the inorganic thin film and the organic polymer thin film.

Further, step S103 includes:

S1031: forming the inorganic thin film on the organic electroluminescent device.

S1032: forming the nano rod-shaped thin film on the inorganic thin film

S1033: forming the organic polymer thin film on the nano rod-shaped thin film.

For example, step S1031 includes:

Forming the nano rod-shaped thin film on the inorganic thin film by vacuum evaporating, ion beam sputtering, magnetron-control sputtering deposition or atomic layer deposition, wherein an included angle between an injected particle flux for forming the nano rod-shaped thin film and a normal line of the inorganic thin film is 40°~85°.

The OLED device can be covered with a layer or several layers of thin film packaging layers according to the actual needs, and in a case where both water resistance and oxygen resistance capacity and lightening and thinning are taken into account, the OLED device can be covered with 1~20 layers of thin film packaging layers.

In order to simplify the production flow of the packaging method and reduce the production process of the packaging method, the embodiment of the present invention the packaging method may further comprises: forming a second thin film packaging layer on the organic electroluminescent device. The second thin film packaging layer comprises an inorganic thin film and an organic polymer thin film. That is, in the embodiment of the present invention, similarly, in a case where the water resistance and oxygen resistance capacity and the lightening and thinning are taken into account, a sum of the numbers of the first thin film packaging layer and the second thin film packaging layer is 1~20.

But if there are too much thin film packaging layers, the intensity of exiting light of the display device may be affected, reducing the display effect of the display device; while if there are few thin film packaging layers, the tightness of the OLED device may not be guaranteed, so preferably, the number of the first thin film packaging layer is 3~5, at which time, the intensity of exiting light of the display device will be good, meanwhile the tightness of the OLED device will be guaranteed. Similarly, a sum of the numbers of the first thin film packaging layer 3 and the second thin film packaging layer 4 is preferred 3~5.

In the embodiment of the present invention, the nano rod-shaped thin film 33 may be made from a metal oxide, a metal nitride or a metal sulfide; similarly, the inorganic thin film 31 is also made from one of a metal oxide, a metal sulfide and a metal nitride.

The foregoing embodiments merely are exemplary embodiments of the invention, and not intended to define the scope of the invention, and the scope of the invention is determined by the appended claims.

The present application claims priority of Chinese Patent Application No. 201410177534.1 filed on Apr. 29, 2014, the disclosure of which is incorporated herein by reference in its entirety as part of the present application.

What is claimed is:

1. A packaging structure of an organic electroluminescent device, comprising:
   a base substrate for supporting the organic electroluminescent device;
   the organic electroluminescent device located on the base substrate; and
   at least one first thin film packaging layer covering the organic electroluminescent device, the first thin film packaging layer comprising an inorganic thin film, an organic polymer thin film and a nano rod-shaped thin film located between the inorganic thin film and the organic polymer thin film.

2. The packaging structure according to claim 1, further comprising a second thin film packaging layer, the second thin film packaging layer comprising an inorganic thin film and an organic polymer thin film, and the second film layer being located above or below the first thin film packaging layer.

3. The packaging structure according to claim 1, wherein a number of the at least one first thin film packaging layer is 1~20.

4. The packaging structure according to claim 3, wherein the number of the at least one first thin film packaging layer is 3~5.

5. The packaging structure according to claim 2, wherein a sum of numbers of the at least one first thin film packaging layer and the second thin film packaging layer is 2~20.

6. The packaging structure according to claim 5, wherein a sum of the numbers of the at least one first thin film packaging layer and the second thin film packaging layer is 3~5.

7. The packaging structure according to claim 1, wherein the inorganic thin film is made from one of a metal oxide, a metal sulfide and a metal nitride; and the nano rod-shaped thin film is made from one of a metal oxide, a metal sulfide and a metal nitride.

8. The packaging structure according to claim 1, wherein the inorganic thin film and the nano rod-shaped thin film in the first thin film packaging layer are made from a material with a same chemical composition.

9. A display device, comprising the packaging structure of the organic electroluminescent device according to claim 1.

10. A packaging method of an organic electroluminescent device, comprising:
    providing a base substrate;
    preparing the organic electroluminescent device on the base substrate; and
    forming at least one first thin film packaging layer on the organic electroluminescent device, the first thin film packaging layer comprising an inorganic thin film, an organic polymer thin film and a nano rod-shaped thin film located between the inorganic thin film and the organic polymer thin film.

11. The packaging method according to claim 10, wherein forming the first thin film packaging layer on the organic electroluminescent device includes:
    forming the inorganic thin film on the organic electroluminescent device;
    forming the nano rod-shaped thin film on the inorganic thin film; and
    forming the organic polymer thin film on the nano rod-shaped thin film.

12. The packaging method according to claim 11, wherein forming the nano rod-shaped thin film on the inorganic thin film includes:
    forming the nano rod-shaped thin film on the inorganic thin film by vacuum evaporating, ion beam sputtering, magnetron-control sputtering deposition or atomic layer deposition, wherein an included angle between an injected particle flux for forming the nano rod-shaped thin film and a normal line of the inorganic thin film is 40°~85°.

13. The packaging method according to claim 12, further comprising: forming a second thin film packaging layer on the organic electroluminescent device, wherein the second thin film packaging layer comprises the inorganic thin film and the organic polymer thin film.

14. The packaging method according to claim 11, wherein, the number of the at least one first thin film packaging layer is 1~20.

15. The packaging method according to claim 14, wherein, the number of the at least one first thin film packaging layer is 3~5.

16. The packaging method according to claim 13, wherein, a sum of numbers of the at least one first thin film packaging layer and the second thin film packaging layer is 2~20.

17. The packaging method according to claim 16, wherein, a sum of the numbers of the at least one first thin film packaging layer and the second thin film packaging layer is 3~5.

18. The packaging method according to claim 10, wherein, the inorganic thin film is made from one of a metal oxide, a metal sulfide and a metal nitride; and the nano rod-shaped thin film is made from one of a metal oxide, a metal sulfide and a metal nitride.

19. The packaging structure according to claim 2, wherein the inorganic thin film is made from one of a metal oxide, a metal sulfide and a metal nitride; and the nano rod-shaped thin film is made from one of a metal oxide, a metal sulfide and a metal nitride.

20. The packaging method according to claim 10, further comprising: forming a second thin film packaging layer on the organic electroluminescent device, wherein the second thin film packaging layer comprises the inorganic thin film and the organic polymer thin film.

\* \* \* \* \*